US006976854B2

(12) United States Patent
Stockhaus et al.

(10) Patent No.: US 6,976,854 B2
(45) Date of Patent: Dec. 20, 2005

(54) ARRANGEMENT FOR CONNECTING THE TERMINAL CONTACTS OF AN ELECTRONIC COMPONENT TO A PRINTED CIRCUIT BOARD AND CONDUCTOR SUPPORT FOR SUCH AN ARRANGEMENT

(76) Inventors: Andreas Stockhaus, Dillenburgerstrasse 56C, Berlin (DE) 14199; Christian Carstens, Ketziner Strasse 50, Fahrland (DE) 14476

( * ) Notice: Subject to any disclaimer, the term of this patent is extended or adjusted under 35 U.S.C. 154(b) by 0 days.

(21) Appl. No.: 10/773,964

(22) Filed: Feb. 5, 2004

(65) Prior Publication Data

US 2005/0085104 A1    Apr. 21, 2005

Related U.S. Application Data

(60) Provisional application No. 60/512,028, filed on Oct. 17, 2003.

(51) Int. Cl.[7] ............................................. H01R 12/20
(52) U.S. Cl. ....................................................... 439/79
(58) Field of Search ........................... 439/79, 629, 59, 439/165, 326, 60, 62, 80, 108, 260, 496, 439/83; 379/434; 361/782; 29/840, 842

(56) References Cited

U.S. PATENT DOCUMENTS

| | | | | |
|---|---|---|---|---|
| 5,027,394 A | * | 6/1991 | Ono et al. | 379/434 |
| 5,482,474 A | * | 1/1996 | Yohn et al. | 439/79 |
| 5,681,176 A | * | 10/1997 | Ibaraki et al. | 439/165 |
| 6,234,820 B1 | * | 5/2001 | Perino et al. | 439/326 |

FOREIGN PATENT DOCUMENTS

DE            10064577 A1      7/2002

* cited by examiner

*Primary Examiner*—Alexander Gilman
(74) *Attorney, Agent, or Firm*—Workman Nydegger

(57) ABSTRACT

An arrangement for connecting the terminal contacts of an electronic component to electrical contacts formed on a printed circuit board. An at least partly flexible conductor support having a plurality of interconnects provides an electrical connection between the terminal contacts of the electronic component and the electrical contacts of the printed circuit board such that a portion of the conductor support that is connected to the printed circuit board is arranged on an end face of the printed circuit board and extends perpendicularly in relation to the upper and lower surfaces of the printed circuit board. Furthermore, a conductor support formed with relatively narrow middle portion is provided to facilitate such an arrangement.

14 Claims, 5 Drawing Sheets

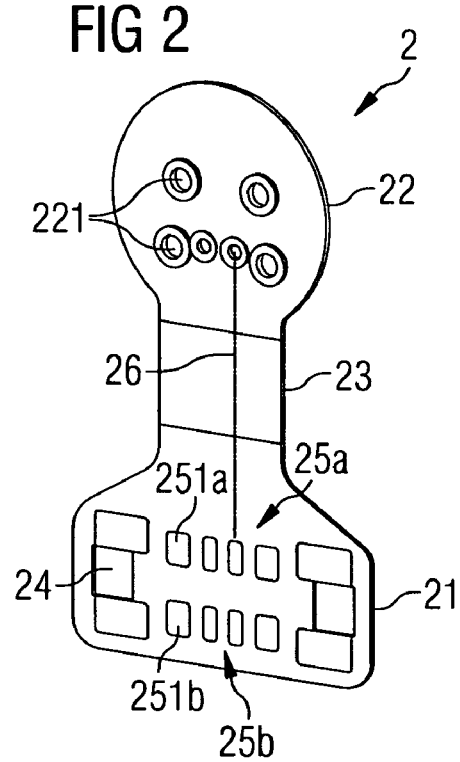
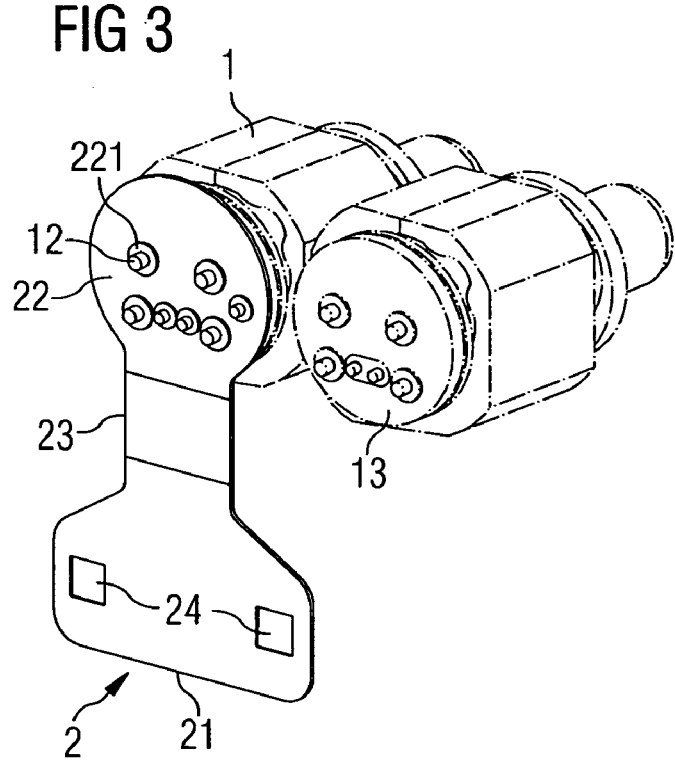

ARRANGEMENT FOR CONNECTING THE TERMINAL CONTACTS OF AN ELECTRONIC COMPONENT TO A PRINTED CIRCUIT BOARD AND CONDUCTOR SUPPORT FOR SUCH AN ARRANGEMENT

RELATED APPLICATION

The present application claims priority of U.S. patent application Ser. No. 60/512,028 filed by Andreas Stockhaus and Christian Carstens on Oct. 17, 2003.

FIELD OF THE INVENTION

The invention relates to an arrangement for connecting the terminal contacts of an electronic component to a printed circuit board and to a conductor support for such an arrangement. In particular, the invention relates to the electrical connection of the terminal pins of an optical transmitting and/or receiving device to a printed circuit board using a flexible conductor.

BACKGROUND OF THE INVENTION

It is known from DE 100 64 577 A1 to solder the terminal pins of a TO package which contains an optical transmitting and/or receiving device directly to a printed circuit board. Since both the printed circuit board and the TO package are fixed in a common housing (usually a transceiver housing), inadmissibly high mechanical stresses can occur, however, at the soldering points due to mechanical tolerances and thermal expansion.

Furthermore, it is known to connect the terminal pins of a TO package with a flexible conductor. Flexible conductors are arrangements known in the prior art in which interconnects have been applied to one, both or several sides of a flexible, insulating substrate. The connection between the terminal pins of a TO package and a flexible conductor generally takes place by means of via holes in the flexible conductor, through which the terminal pins are inserted. Flexible conductors have the advantage that they have favorable RF properties at high frequencies in the GHz range. In addition, they allow compensation for tolerances with regard to the arrangement of an optoelectronic component with respect to a printed circuit board.

An arrangement with a flexible conductor known in the prior art for the electrical connection of an electronic component to a printed circuit board is represented in FIGS. 8 and 9. Two optoelectronic components 100 are electrically connected to a printed circuit board 300 in each case by means of a flexible conductor 200.

The optoelectronic components are, for example, a transmitting module and a receiving module, which are arranged next to each other. In the exemplary embodiment represented, the optoelectronic components 100 have a TO package, in which optoelectronic components such as a laser diode or a receiving diode are arranged. Protruding perpendicularly from a base plate 121 (cf. FIG. 9) of the package are terminal pins for the electrical contacting of the optoelectronic component 100. In the case of other housing designs, the terminal contacts may be formed in some other way, for example as leadframe legs.

The electrical contacting of the terminal pins 112 of the optoelectronic component 100 with respect to associated electrical contacts of the printed circuit board 300 takes place by means of the flexible conductor 200. The latter has a first portion 201, which runs parallel to the base plate 121 of the component 100 and contacts the terminal pins 112. For this purpose, via holes are formed for example in the flexible conductor. The opposite end of the flexible conductor 200 forms a portion 202, which runs parallel to the printed circuit board 300 and is connected to the latter. Provided in this case on the underside of the flexible conductor in the portion 202 are solder pads, which are connected to corresponding contact regions of the printed circuit board 300. This generally takes place by the portion 202 being pressed against the printed circuit board 300 by a hot die. Mechanical fastening of the flexible conductor 200 to the printed circuit board takes place subsequently by means of a so-called "underfill". In this case, additional material is inserted between the flexible conductor portion 202 and the printed circuit board 300 for purposes of mechanical fastening and stabilization.

Between the portion 201 for the contacting of the optoelectronic component 100 and the portion 202 for the contacting of the printed circuit board there is a twice-bent portion of the flexible conductor, comprising the portions 203a, 203b, 203c. In the portion 203a, a first bending of the flexible conductor by approximately 180° takes place. The portion 203c adjoining said first portion is substantially straight. There follows a further portion 203b, which is bent by approximately 90° and in which the flexible conductor merges with the portion 202, which is fastened on the printed circuit board 300.

The arrangement according to FIGS. 8 and 9, which is known in the prior art, has a number of disadvantages. A first disadvantage is that the flexible conductor has a relatively high space requirement on the printed circuit board. In addition to the directly covered area, there is in this case a "keep out area" for further components, which is not visible. The intention of such a "keep out area" is to avoid possible damage to components during the fastening of the flexible conductor.

A second disadvantage is that the bending twice of the flexible conductor creates a bending portion close to the solder pads, whereby high shear loading of the soldering region is produced. This also causes high tensile loading on the interconnects and causes the flexible conductor to lose its flexibility as a result of the double bending. Further disadvantages are that reworking of the soldered and adhesively bonded connections is complicated, since both the layers of adhesive and the soldering points have to be detached simultaneously, and also that a much greater surface area is required on the printed circuit board as soon as a second row of contacts is required because of a high number of contacts. It is also a disadvantage of the known arrangement that the quality of the soldering cannot be visually monitored. Finally, with the known arrangement it is sometimes required to provide a separate connecting element which aligns the flexible conductor with respect to the printed circuit board and mechanically fastens it on the latter.

SUMMARY OF THE INVENTION

The present invention is based on the object of providing an arrangement for connecting the terminal contacts of an electronic component to a printed circuit board which is particularly space-saving and with which only low forces are exerted on existing soldered connections. Furthermore, it is intended to provide a conductor support for use in such an arrangement.

This object is achieved according to the invention by an arrangement for connecting the terminal contacts of an electronic component to a printed circuit board which has:

an electronic component with terminal contacts, a printed circuit board with electrical contacts, and an at least partly flexible conductor support with a plurality of interconnects, the conductor support providing an electrical connection between the terminal contacts of the optoelectronic component and the electrical contacts of the printed circuit board, and the portion of the conductor support that is connected to the printed circuit board being arranged on an end face (peripheral edge) of the printed circuit board and running perpendicularly in relation to the surface of the printed circuit board.

The solution according to the invention is consequently distinguished by the idea of not aligning the portion of the conductor support that is to be connected to the printed circuit board parallel to the printed circuit board, as in the prior art, but instead arranging it on an end face of the printed circuit board, the conductor support in this portion running perpendicularly in relation to the surface of the printed circuit board.

The solution according to the invention is extremely space-saving, since scarcely any additional space is required on the surface of the printed circuit board for the connection to the conductor support. The alignment of the conductor support perpendicular to the surface of the printed circuit board also achieves the effect that only one bend of the conductor support is required. As a result, the shear loading of the soldering of the conductor support on the printed circuit board is reduced, so that its durability is improved. Since the remaining bend is at a distance from the contact regions of the conductor support, tensile loading of the interconnects of the conductor support is also additionally reduced. This is of significance in particular for the radio-frequency interconnects, which are of a particularly thin form and are particularly at risk of tearing.

The solution according to the invention further allows a locational separation of the adhesive bonding and soldering of the conductor support on the printed circuit board, whereby reworking of the soldered and adhesively bonded connections is made easier. Consequently, the soldering points and adhesive-bonding points can be detached at different times. In one configuration it is also possible in an advantageous way to dispense entirely with an adhesive bond, since adequate mechanical strength of the connection is already provided by the soldering itself.

It is pointed out that, for the purposes of the present invention, an electronic component is understood as meaning any electronic component or module performing a function. The term covers an optoelectronic component with a light-generating element and/or a light-receiving element in just the same way as for instance a printed circuit board (which is connected to another printed circuit board by means of a flexible conductor support).

In a preferred configuration, it is provided that the flexible conductor support has a first portion with first contact regions for the connection to associated electrical contacts of the printed circuit board and a second portion with second contact regions for the electrical connection to the terminal contacts of the electronic component. The first contact regions are in this case in connection with electrical contacts of the printed circuit board, which on the surface of the printed circuit board are led up to the end face and are adjacent to the latter. Consequently, contacting with respect to the contact regions of the flexible conductor support arranged on the end face can take place by means of a solder in the edge region.

In a development of this configuration, it is provided that the first portion of the conductor support has two rows of first contact regions. The contact regions of the first row are connected to electrical contacts on the one surface of the printed circuit board and the contact regions of the second row are connected to electrical contacts on the other surface of the printed circuit board. This allows the required space on the printed circuit board to be kept small in spite of a high number of contacts.

In a further configuration, it is provided that the printed circuit board has adjusting structures and the conductor support has adjusting structures corresponding to them in the portion that is connected to the printed circuit board. For example, it is provided that the printed circuit board has at least one projection on the end face. The conductor support accordingly has in the portion that is connected to the printed circuit board at least one clearance corresponding to a projection of the printed circuit board.

It has already been noted that the conductor support is preferably bent only once between the first portion and the second portion of the conductor support, for instance by approximately 180°. This has the effect of reducing shearing stresses and tensile stresses that occur.

The at least partly flexible conductor support is preferably a flexible conductor.

The invention also relates to a preferred configuration of a conductor support which is used in the arrangement for connecting the terminal contacts of an electronic component to a printed circuit board. The conductor support has:

a number of interconnects formed on or in (herein "formed on") an at least partly flexible, planar dielectric;

a first portion with first contact regions for the connection of the interconnects to associated electrical contacts of a printed circuit board, a second portion with second contact regions for the electrical connection of the interconnects to the terminal contacts of an electronic component, and a third portion, which lies in between and, in comparison with at least one of the other portions, is formed such that it is narrower.

The conductor support according to the invention consequently has a reduced width in the third portion, which is bent when the conductor support is used. As a result, a bending portion of the conductor support is defined and established, since the conductor support can be bent most easily in the portion of reduced width. The ease of handling the conductor support is improved in this way. The space requirement of the conductor support is also reduced by the provision of a portion of reduced width.

The third portion of the conductor support preferably has a smaller width than the first portion and also a smaller width than the second portion. The first portion is formed such that it is for example substantially rectangular and the second portion is formed such that it is for example substantially circular.

BRIEF DESCRIPTION OF THE DRAWINGS

The invention is explained in more detail below on the basis of an exemplary embodiment with reference to the figures, in which:

FIG. 2 shows a plan view of a not bent flexible conductor;

FIG. 3 shows the not bent flexible conductor of FIG. 2 in connection with an electronic component;

DESCRIPTION OF A PREFERRED EXEMPLARY EMBODIMENT

Figure 1:
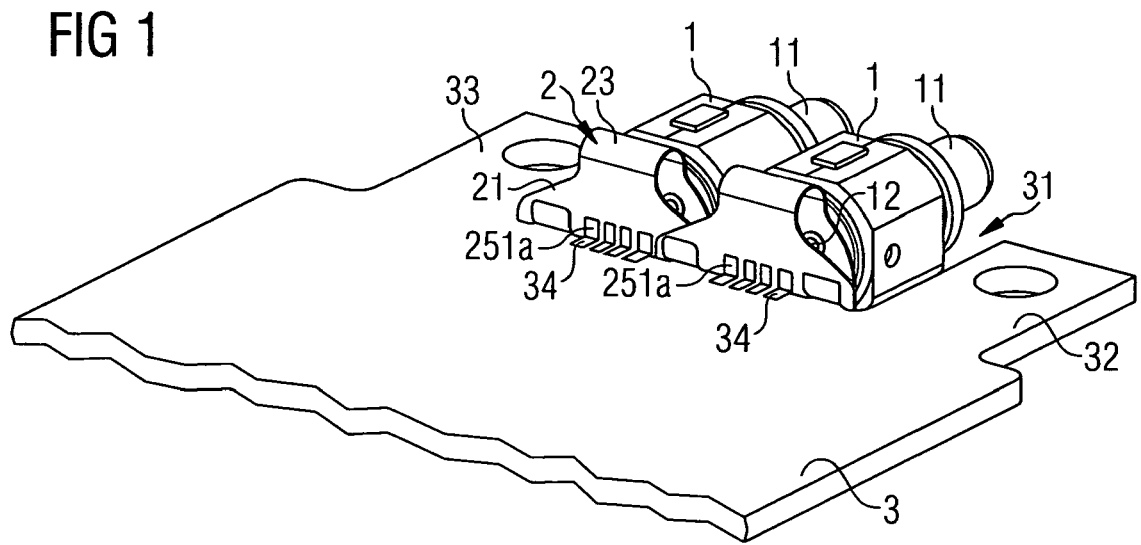
FIG. 1 shows in a perspective view an exemplary embodiment of an arrangement with an electronic component, a flexible conductor and a printed circuit board, the flexible conductor being arranged on an edge of the printed circuit board.
Figure 4:
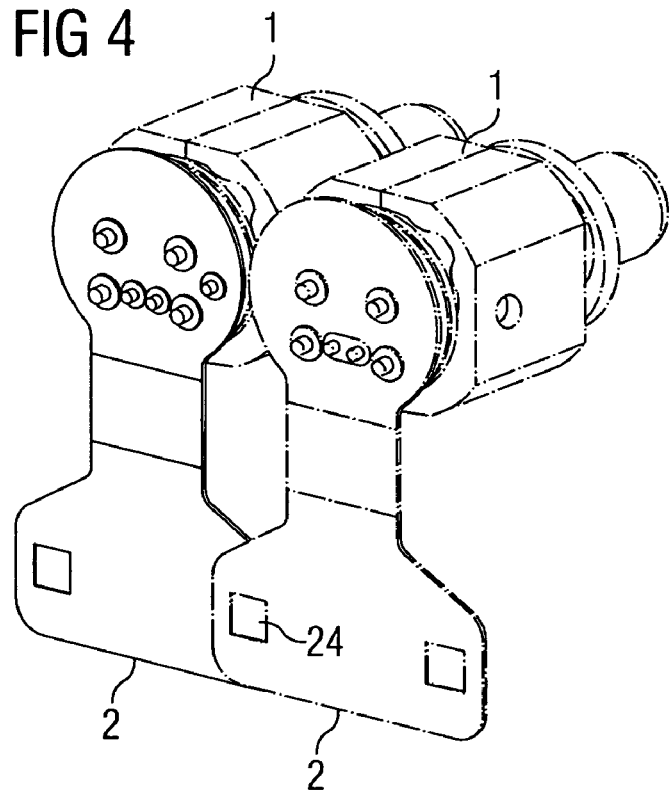
FIG. 4 shows two flexible conductors according to FIG. 2, arranged next to each other, with assigned electronic components.
Figure 5:
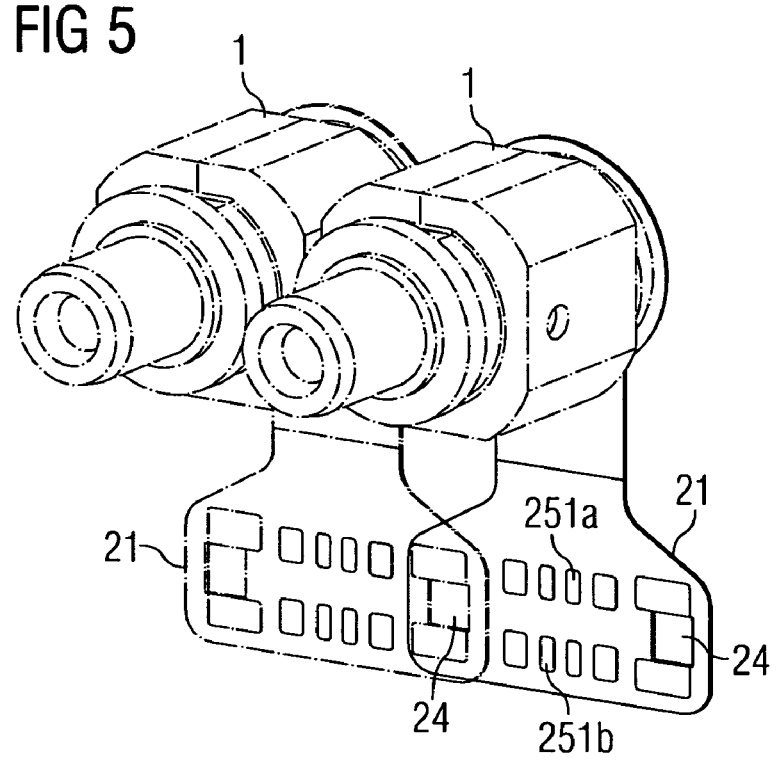
FIG. 5 shows the arrangement of FIG. 4 in a perspective view from the front.

FIG. 1 shows an arrangement for connecting the terminal contacts of an electronic component to a printed circuit board which has two electronic components 1, respectively assigned flexible conductors 2 and a printed circuit board 3.

In the exemplary embodiment represented, the electronic components 1 are optoelectronic components, which convert electrical signals into optical signals, or vice versa. One of the two optoelectronic components 1 arranged next to each other is in this case preferably a transmitting component and the other is a receiving component. For optical coupling to an optical fiber, a plug region 11 is provided. However, it is pointed out that the arrangement is suitable in principle for the contacting of any desired electronic components.

For their contacting, the optoelectronic components 1 have electrical contacts 12, which are illustrated well in FIG. 3. In the exemplary embodiment represented, they are terminal pins 12, which protrude from a base plate 13 of the optoelectronic component 1. The terminal contacts may, however, also be realized in some other way, for example as leadframe legs of a leadframe which contacts the optoelectronic component.

Serving for the contacting of the electrical contacts of the optoelectronic component 1 with respect to associated electronic contacts of the printed circuit board 3 is the flexible conductor 2, which represents a flexible conductor support comprising a dielectric with a plurality of interconnects.

FIG. 2, to which reference is additionally made in this respect, shows the flexible conductor 2 in the not bent state. The flexible conductor 2 has a first portion 21 with first contact regions 251a, 251b, which serve for the connection of the interconnects of the flexible conductor 2 to associated electrical contacts on the printed circuit board 3. The first contact regions 251a, 251b, formed as contact pads, are in this case arranged in two parallel rows 25a, 25b.

The flexible conductor 2 also has a second portion 22 with second contact regions 221 for the electrical connection of the interconnects to the terminal contacts of the electronic component 1. In the exemplary embodiment represented, these second contact regions 221 are formed as via holes. Depending on the type of terminal contacts of the electronic component 1 to be contacted, however, the contact regions 221 of the second portion 22 may also be formed in some other way, for example as contact pads.

The actual interconnects, which end at the respective contact regions 221, 251a, 251b, cannot be seen in the figures, since in the case of the configuration represented they are covered by a layer of resist. Only one interconnect (elongated conductor) 26, which extends between contact regions 221 and 251a, is schematically indicated in FIG. 2.

Finally, the flexible conductor 2 has a third portion 23, lying between the first portion 21 and the second portion 22. According to FIG. 1, this portion is bent by approximately 180°, so that the first portion 21 and the second portion 22 run substantially parallel to each other.

It is pointed out that, in comparison with the first portion 21 and the second portion 22, the third portion 23 is formed such that it is narrower, i.e. has a smaller width. This is advantageous to the extent that a lower rigidity is provided as a result in the bending region. The smaller width also has the effect of establishing a bending region, which improves the ease of handling the flexible conductor.

It should be noted that the flexible conductor 2 has a planar form, i.e. the thickness of the flexible conductor is small in comparison with the linear extent and lateral extent. Apart from the bend of the flexible conductor 2, the interconnects lie in one plane.

According to FIG. 1, the first portion 21 of the flexible conductor 2 is pressed against an end face (edge) of the printed circuit board 3. The printed circuit board 3 defines on its end face a substantially rectangular clearance 31, which serves for receiving the two optoelectronic components 1. The clearance 31 is in this case bounded by two lateral projections 32, 33.

On the surface of the printed circuit board 3 there are contact pads 34, which are connected to interconnects (not represented) of the printed circuit board 3. Additional electronic components (not represented), for instance a driver module and a preamplifier, are preferably arranged on the printed circuit board 3 for the optoelectronic components 1.

The electrical connection between the contact pads 251a of the first portion 21 of the flexible conductor 2 and the assigned contact pads 34 of the printed circuit board takes place as follows. The contact pads 34 of the printed circuit board 3 are led up to the end face of the printed circuit board and adjoin to the latter. After pressing the portion 21 of the flexible conductor 2 against the end face of the printed circuit board 3, soldering paste is applied to the contact regions (contact pads) 251a, 34 and melted, for example by a hot-air fan. The soldering takes place manually or alternatively as part of reflow soldering or by other soldering methods.

It is preferably provided that, in the same way as the contact regions 251a of the first row 25a of contact pads were connected to associated electrical contacts 34 on the one, upper side of the printed circuit board, the contact regions 251b arranged in a second row 25b are connected to assigned electrical contacts on the underside of the printed circuit board 23. The electrical connection between contacts 34 of the printed circuit board 3 and contacts of the flexible conductor 2 consequently also takes place mirror-symmetrically on the underside of the printed circuit board 3. This provides a particularly preferred configuration, since, in spite of the doubling of the terminal contacts, there is no additional space requirement on the printed circuit board 3. Consequently, a multiplicity of electrical connections between the flexible conductor 2 and the printed circuit board 3 can be provided in a very effective way.

A further advantage of this configuration is that a very secure mechanical connection between the flexible conductor and the printed circuit board is provided by the soldering alone: by solderings on both edges of the printed circuit board, the cross section that is subjected to loading is enlarged to the thickness of the printed circuit board. The good mechanical strength may make it possible to dispense with separate adhesive bonding.

Figure 7:
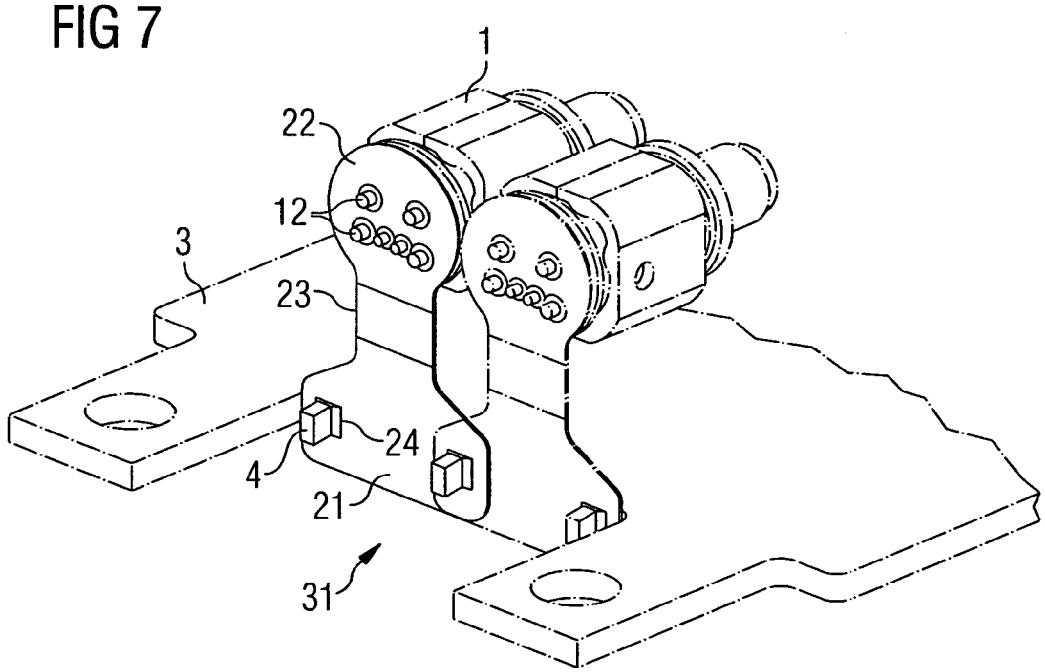
FIG. 7 shows the representation of FIG. 6 from another perspective view.
Figure 8:
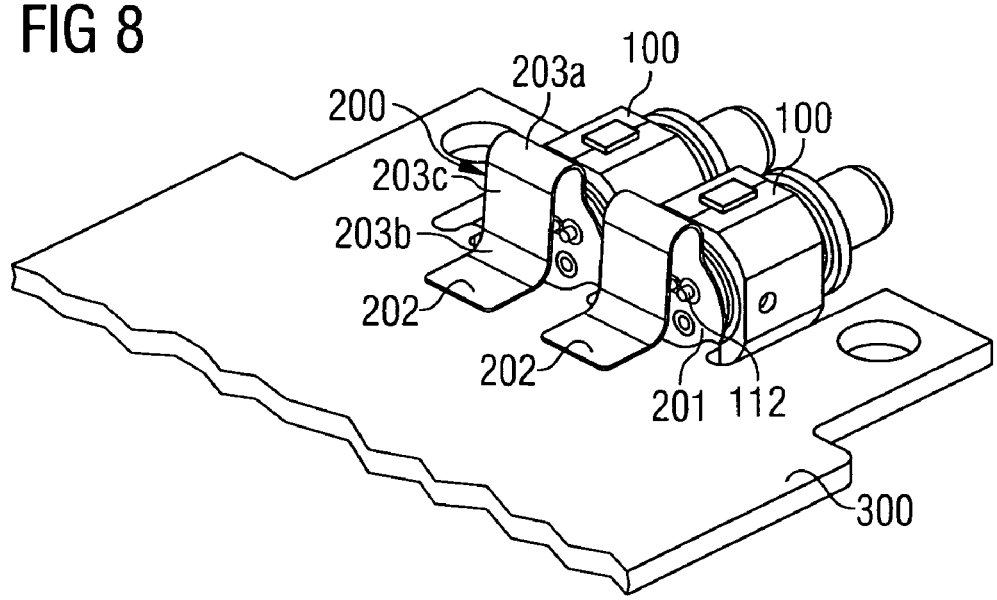
FIG. 8 shows an arrangement known in the prior art with an electronic component, a printed circuit board and a flexible conductor.
Figure 9:
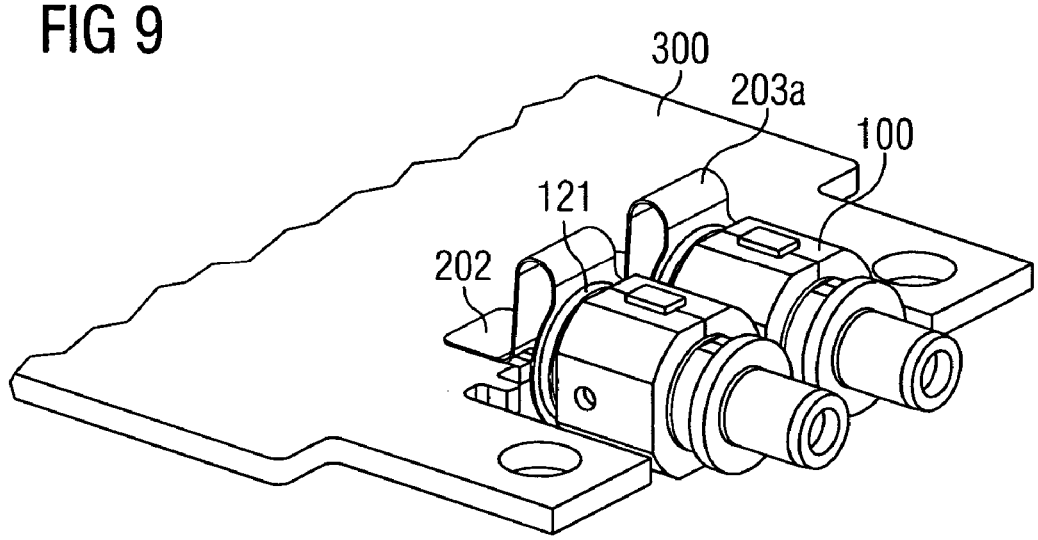
FIG. 9 shows a perspective view of the arrangement of FIG. 8 obliquely from the front.

For the mechanical connection to the printed circuit board 3 and adjustment of the flexible conductor 2 on said printed circuit board 3, the latter has on its end face—as FIG. 7 illustrates—projections or pins 4, which engage in corresponding clearances 24 in the flexible conductor 2.

In this case, other adjusting structures may also be provided in the region of the end face of the printed circuit board 3. What is important here is that the structures on the flexible conductor 2 are formed in a corresponding way.

FIGS. 2 to 5 show the optoelectronic components 1 with the not bent flexible conductor 2 in various representations. According to FIGS. 4 and 5, the two optoelectronic components 1 are arranged at such a distance from each other and the clearances 24 are formed in the flexible conductor 2 in such a way that the flexible conductors 2 of neighboring optoelectronic components 1 overlap one another in the first portion 21 and in this case the clearances 24 of the overlapping sides are aligned one over the other. This allows the number of adjusting projections on the end face of the printed circuit board 3 to be minimized.

Figure 6:
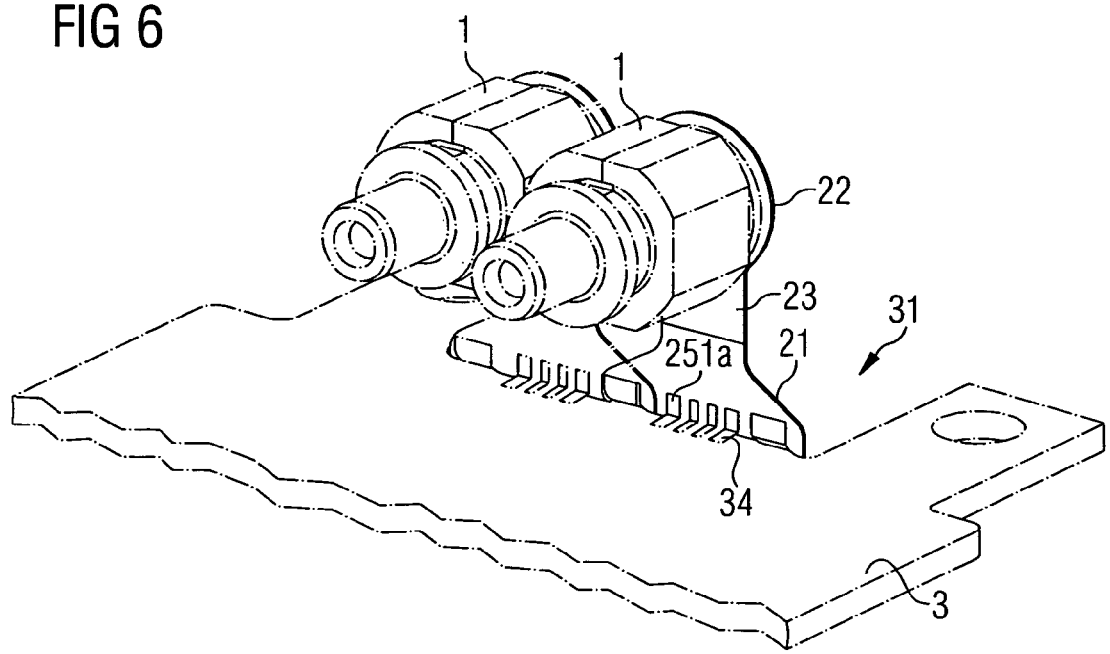
FIG. 6 shows the arrangement of two electronic components according to FIGS. 4, 5 on a printed circuit board, which are respectively connected to a flexible conductor, an intermediate step in the arrangement of the electronic components on the printed circuit board being represented.

FIGS. 6 and 7 show an intermediate step in the production of the arrangement according to FIG. 1. Firstly, the not yet bent flexible conductors 2 are connected at their second portion 22 to terminal contacts 12 of the optoelectronic components 1. This subarrangement is then aligned and mechanically fixed on the printed circuit board 3 by means of the projections 4 on the end face of the printed circuit board 3 and the clearances 24 in the flexible conductor. FIGS. 6 and 7 show this state. It is then possible right away, or alternatively after pivoting the optoelectronic components 1 by 180°, with the flexible conductor being bent by 180° in the portion 23, to perform an electrical connection between the contact regions 251a, 251b of the flexible conductor 2 and the associated contacts 34 of the printed circuit board 3 by soldering. Subsequently, the flexible conductor 2 can also be grounded in a mechanically secured manner by means of an adhesive on the projections 4 on the end face of the printed circuit board 3.

Since the soldering regions for the connection of the contact regions 251a, 251b to electrical contacts 34 on the printed circuit board are relatively far away from the bend 23 of the flexible conductor 2, only low shear loading acts on the soldering. The interconnects are also only subjected to low tensile loading.

The invention is not restricted in its configuration to the exemplary embodiment presented above, which is to be understood as only given by way of example. A person skilled in the art recognizes the existence of numerous alternative variants for the embodiment, which, in spite of their departure from the exemplary embodiment described, make use of the teaching defined in the claims which follow. For example, it may be provided that the flexible conductor has only one row 25a of contact regions. These may be connected to assigned electrical contacts on the upper side or on the underside of the printed circuit board. Furthermore, electronic components of a different type and design may be used for example. The flexible conductor may also take different forms.

We claim:

1. An arrangement comprising:
   an electronic component with terminal contacts,
   a printed circuit board with electrical contacts that are formed on a surface of the printed circuit board and extend toward an end face of the printed circuit board, and
   an at least partly flexible conductor support with a plurality of interconnects, the conductor support providing an electrical connection between the terminal contacts of the electronic component and the electrical contacts of the printed circuit board, wherein a portion of the conductor support extends next to and adjacent to the end face of the printed circuit board and extends perpendicularly in relation to the surface of the printed circuit board, and wherein said portion is connected to the electrical contacts of the printed circuit board wherein the electrical contacts formed on the printed circuit board include a first electrical contact formed on a surface of the printed circuit board at an end of the end face, and wherein the portion of the conductor support is connected to the electrical contact by way of a solder structure.

2. The arrangement as claimed in claim 1, the flexible conductor support comprising a flexible conductor.

3. The arrangement as claimed in claim 1, the electrical components being an optoelectronic component comprising at least one of a light-generating element and a light-receiving element.

4. The arrangement as claimed in claim 1,
   wherein the electrical contacts formed on the printed circuit board include a first electrical contact formed on a first surface of the printed circuit board at a first end of the end face, and a second electrical contact formed on a second surface of the printed circuit board at a second end of the end face, and
   wherein the portion of the conductor support is connected to both the first and second electrical contacts by way of first and second solder structures, respectively.

5. The arrangement as claimed in claim 1, wherein the conductor support includes a first portion with first contact regions for the connection to associated electrical contacts of the printed circuit board and a second portion with second contact regions for the electrical connection to the terminal contacts of the electronic component, and the first contact regions being in connection with electrical contacts of the printed circuit board, which on the surface of the printed circuit board are led up to the end face and are adjacent to the latter.

6. The arrangement as claimed in claim 5, wherein the conductor support is bent approximately 180° between the first portion and the second portion.

7. The arrangement as claimed in claim 1, the printed circuit board having adjusting structures and the conductor support having adjusting structures corresponding to them in the portion that is connected to the printed circuit board.

8. The arrangement as claimed in claim 7, the printed circuit board having at least one projection on the end face.

9. The arrangement as claimed in claim 7, the conductor support having in the portion that is connected to the printed circuit board at least one clearance corresponding to a projection of the printed circuit board.

10. An arrangement comprising:
    an electronic component including a terminal contact;
    a printed circuit board having parallel upper and lower surfaces, and a peripheral edge extending between the upper and lower surfaces, the printed circuit board also including an electrical contact formed on one of the upper and lower surfaces; and an at least partially flexible conductor support including an elongated conductor having a first contact region connected to the electrical contact formed on the printed circuit board, and a second contact region connected to the terminal contact of the electronic component, wherein a first portion of the conductor support including the first contact region abuts the peripheral edge of the printed circuit board and extends perpendicular to the upper and lower surfaces wherein the electrical contacts formed on the printed circuit board include a first electrical contact formed on a surface of the printed circuit board at an end of the end face, and wherein the first portion of the conductor support is connected to the electrical contact by way of a solder structure.

11. The arrangement as claimed in claim 10, wherein the electrical contacts formed on the printed circuit board include a first electrical contact formed on the upper surface of the printed circuit board, and a second electrical contact formed on the lower surface of the printed circuit board, and wherein the first portion of the conductor support is connected to both the first and second electrical contacts by way of first and second solder structures, respectively.

12. The arrangement according to claim 10, wherein the conductor support further comprises:

a second portion including second contact region connected to the electronic component; and a third portion extending between the first and second portions, wherein the first and second portions define parallel planes.

13. The arrangement according to claim 12, wherein the third portion is bent approximately 180°.

14. An arrangement comprising:

an electronic component with terminal contacts, a printed circuit board with electrical contacts, and an at least partly flexible conductor support with a plurality of interconnects, the conductor support providing an electrical connection between the terminal contacts of the optoelectronic component and the electrical contacts of the printed circuit board, wherein a portion of the conductor support that is connected to the printed circuit board is arranged on an end face of the printed circuit board and extends perpendicularly in relation to the surface of the printed circuit board, the first portion of the conductor support having two rows of first contact regions, the contact regions of the first row being connected to electrical contacts on the one surface of the printed circuit board and the contact regions of the second row being connected to electrical contacts on the other surface of the printed circuit board.

* * * * *